US011793033B2

(12) United States Patent
Tsaur et al.

(10) Patent No.: US 11,793,033 B2
(45) Date of Patent: Oct. 17, 2023

(54) IMAGE RENDERING IN ORGANIC LIGHT EMITTING DIODE (OLED) DISPLAYS, APPARATUSES, SYSTEMS, AND METHODS

(71) Applicant: KOPIN CORPORATION, Westborough, MA (US)

(72) Inventors: Boryeu Tsaur, Foster City, CA (US); Hong K. Choi, Sharon, MA (US)

(73) Assignee: KOPIN CORPORATION, Westborough, MA (US)

( * ) Notice: Subject to any disclaimer, the term of this patent is extended or adjusted under 35 U.S.C. 154(b) by 151 days.

(21) Appl. No.: 15/931,462

(22) Filed: May 13, 2020

(65) Prior Publication Data

US 2020/0388658 A1   Dec. 10, 2020

Related U.S. Application Data

(60) Provisional application No. 62/911,905, filed on Oct. 7, 2019, provisional application No. 62/847,856, filed on May 14, 2019.

(51) Int. Cl.
| | | |
|---|---|---|
| *H10K 59/122* | (2023.01) | |
| *H10K 50/858* | (2023.01) | |
| *H10K 59/32* | (2023.01) | |
| *H10K 71/00* | (2023.01) | |
| *H10K 50/818* | (2023.01) | |
| *H10K 59/38* | (2023.01) | |

(52) U.S. Cl.
CPC ......... *H10K 59/122* (2023.02); *H10K 50/858* (2023.02); *H10K 59/32* (2023.02); *H10K 71/00* (2023.02); *H10K 50/818* (2023.02); *H10K 59/38* (2023.02)

(58) Field of Classification Search
CPC combination set(s) only.
See application file for complete search history.

(56) References Cited

U.S. PATENT DOCUMENTS

| | | | |
|---|---|---|---|
| 11,143,806 B1 * | 10/2021 | Carbone | H01L 51/5275 |
| 2008/0130278 A1 * | 6/2008 | Ushikubo | H01L 51/5036 362/231 |
| 2008/0290435 A1 * | 11/2008 | Oliver | H01L 27/14632 438/65 |

(Continued)

*Primary Examiner* — Nduka E Ojeh
(74) *Attorney, Agent, or Firm* — PELOQUIN, PLLC; Mark S. Peloquin, Esq.

(57) ABSTRACT

Apparatuses, systems, and methods are described to enhance images rendered on an Organic Light Emitting Diode (OLED) display. An OLED device is formed with a first light emitting OLED stack, a charge generating layer (CGL), a second light emitting OLED stack, and a color filter. An OLED display pixel includes three sub-pixels where each subpixel is fabricated with a separate anode and a color filter. A dielectric barrier is disposed between the separate anodes and around the perimeter of each separate anode of the three sub-pixels. When current flows to a desired sub-pixel of the three sub-pixels, lateral current flow through the CGL to adjacent sub-pixels is impeded, resulting in light generation by the desired sub-pixel and reduction in unwanted light generation at sub-pixels adjacent to the desired sub-pixel. The OLED device can include micro lenses, which collimate light thereby reducing an aperture of emitted light to increase display brightness.

44 Claims, 16 Drawing Sheets

(56) References Cited

U.S. PATENT DOCUMENTS

| | | | |
|---|---|---|---|
| 2009/0128738 A1* | 5/2009 | Matsumoto | G02B 5/0231 |
| | | | 349/64 |
| 2012/0217521 A1* | 8/2012 | Ohta | H01L 51/5281 |
| | | | 257/89 |
| 2014/0103385 A1* | 4/2014 | Hatano | H01L 33/005 |
| | | | 438/28 |
| 2017/0309693 A1* | 10/2017 | Pang | H10K 59/88 |
| 2019/0237706 A1* | 8/2019 | Jin | H01L 51/5271 |
| 2019/0341409 A1* | 11/2019 | Yamabi | H01L 27/14618 |
| 2020/0312930 A1* | 10/2020 | Choi | H01L 51/5278 |
| 2022/0003989 A1* | 1/2022 | Nakamura | G02B 27/0068 |

\* cited by examiner

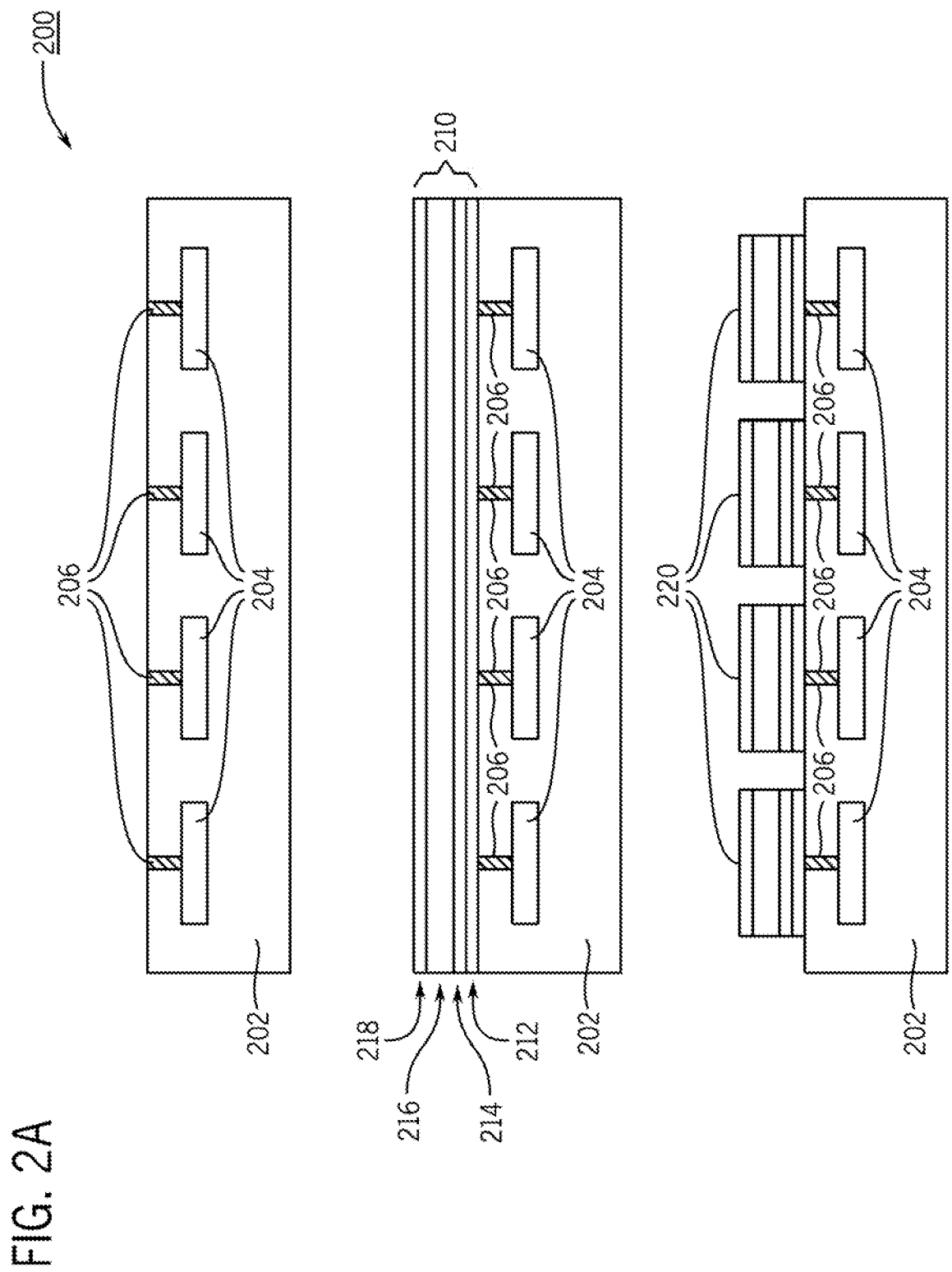

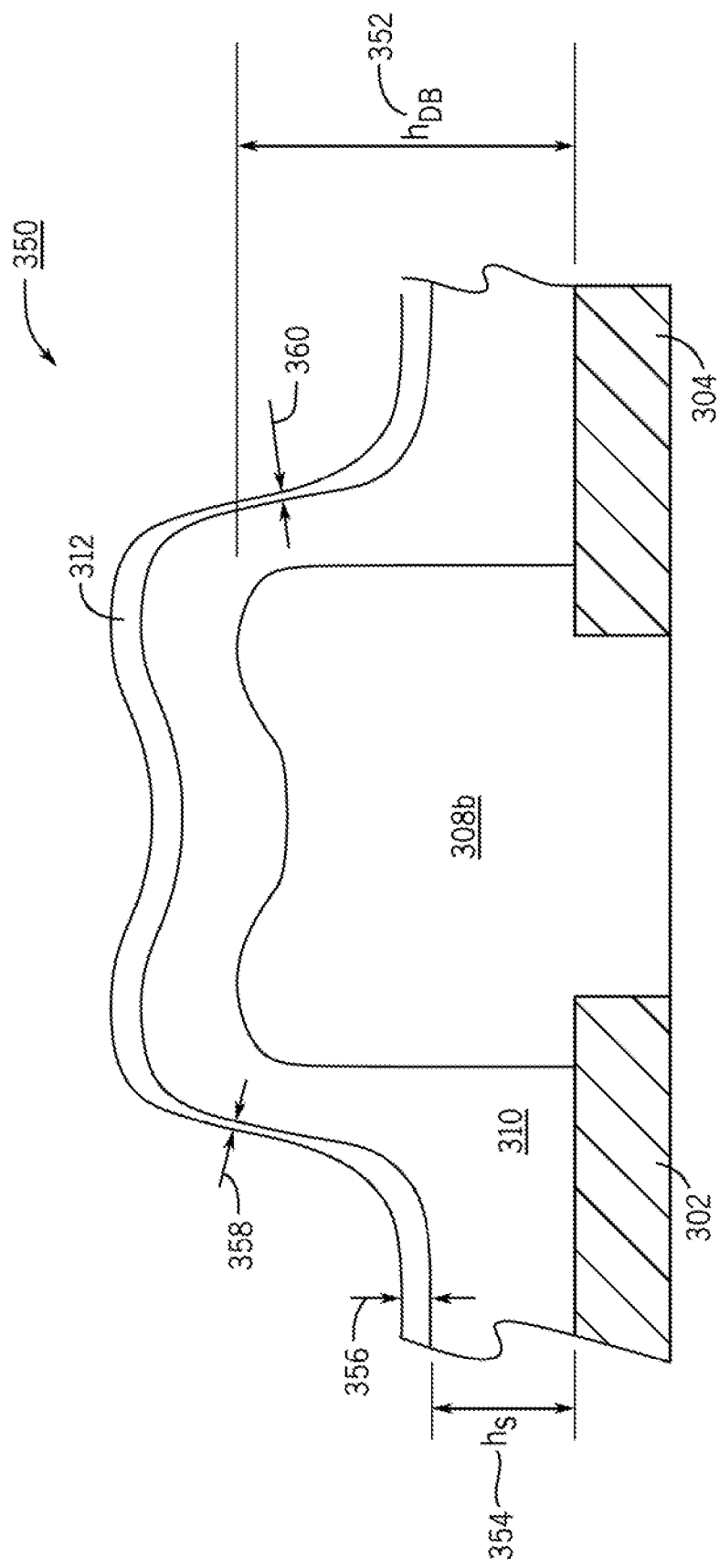

IMAGE RENDERING IN ORGANIC LIGHT EMITTING DIODE (OLED) DISPLAYS, APPARATUSES, SYSTEMS, AND METHODS

RELATED APPLICATIONS

This application claims priority from United States Provisional patent application titled "OLED LIGHT ENHANCEMENT," filed on May 14, 2019, Ser. No. 62/847,856 and this application claims priority from United States Provisional patent application titled "BACKPLANE FOR ORGANIC LIGHT EMITTING DIODE (OLED) DISPLAYS, APPARATUSES, SYSTEMS, AND METHODS," filed on Oct. 7, 2019, Ser. No. 62/911,905.

U.S. Provisional Patent Application Ser. No. 62/847,856 is hereby incorporated by reference. U.S. Provisional Patent Application Ser. No. 62/911,905 is hereby incorporated by reference.

BACKGROUND OF THE INVENTION

1. Field of the Invention

The invention relates generally to displays and more specifically to high brightness Organic Light Emitting Diode (OLED) displays and color purity in OLED displays.

2. Art Background

OLED display technology is advancing at a rapid pace. In particular, development of high efficiency OLED materials as well as high throughput OLED deposition equipment has led to large scale commercialization of OLED displays. An OLED device has organic semiconductor layers that are situated between two electrodes, an anode and a cathode. The electrodes are typically made from inorganic materials. Holes and electrons are injected to the organic layers from the anode and cathode, respectively. When the electrons and holes recombine in the active organic layer, photons are emitted.

A subset of OLED displays is micro OLED displays which are generally smaller than 1 inch in diagonal size. Micro OLED displays typically have backplane integrated circuits fabricated on a single crystal Silicon (Si) substrate. Because of the high performance of Si transistors, a pixel size used to make a high-resolution display in a small size can be very small, typically equal to or less than 15 micrometer (μm). The backplane circuitry includes a pixel array, row/column drivers, video input, video processing, and programmable control.

Because of the small pixel size, full color micro OLED displays are typically made using a white-emitting OLED structure and color filters over it. Each pixel consists of red (R), green (G), and blue (B) subpixels. Each subpixel has its own separate anode, but all the subpixels share a common semi-transparent cathode. Very high resolution displays up to 2560×2560 pixels have been demonstrated using such an OLED configuration.

Micro OLED displays are considered as a leading display candidate for next generation wearable products such as virtual reality (VR), augmented reality (AR), and mixed reality (MR) applications because of its small size and high resolution, low power consumption, and high video frame rate. One key performance challenge for micro OLED in these applications is high brightness operation with acceptable lifetime. Most applications require display brightness in excess of 1000 nits and in some cases 5000-10,000 nits. Although advancement in OLED materials has resulted in significant improvements in OLED brightness, it is very challenging to get such high brightness. This can present a problem.

Attempts to increase OLED display brightness have resulted in multi-stack OLED structures such as a tandem OLED structure 102 an example of which is shown generally at 100 in FIG. 1. However, the white-emitting tandem OLED design applied to micro displays has major drawbacks. Since the subpixel anodes, 110, 112, 114, etc. share a common cathode 116, the current that flows from one anode to the common cathode 116 can spread laterally to adjacent pixels, especially along the highly conductive charge generation layer (CGL) 108 between the two diodes 104 and 106. The lateral current flow manifests itself as "crosstalk" or light leakage, indicated at 122/124 and/or 126/128, which can lead to degradation of image sharpness and more severely to degradation of color purity. For example, a red subpixel 120 could have some blue 128 and green 124 colors mixed in, resulting in poor red color purity. This problem can degrade a display's color gamut substantially, to a point that tandem OLED micro displays are rendered unacceptable for most applications. This can present a problem.

Micro OLED display brightness also suffers from the fact that light output from the OLED emissive elements is Lambertian in nature, which means that it is emitted over a wide output angle, typically greater than plus or minus fifty (50) degrees. As a result, some of the light is not effectively collected by the optics elements used in wearable products, leading to insufficient performance. This can present a problem.

BRIEF DESCRIPTION OF THE DRAWINGS

The invention may best be understood by referring to the following description and accompanying drawings that are used to illustrate embodiments of the invention. The invention is illustrated by way of example in the embodiments and is not limited in the figures of the accompanying drawings, in which like references indicate similar elements.

FIG. 2A-2D illustrates various cross-sections corresponding to process steps during the creation of subpixel anodes, according to embodiments of the invention.

FIG. 3B illustrates, in cross-section, an enlarged view of a portion of the dielectric barrier from FIG. 3A, according embodiments of the invention.

DETAILED DESCRIPTION

Figure 1:
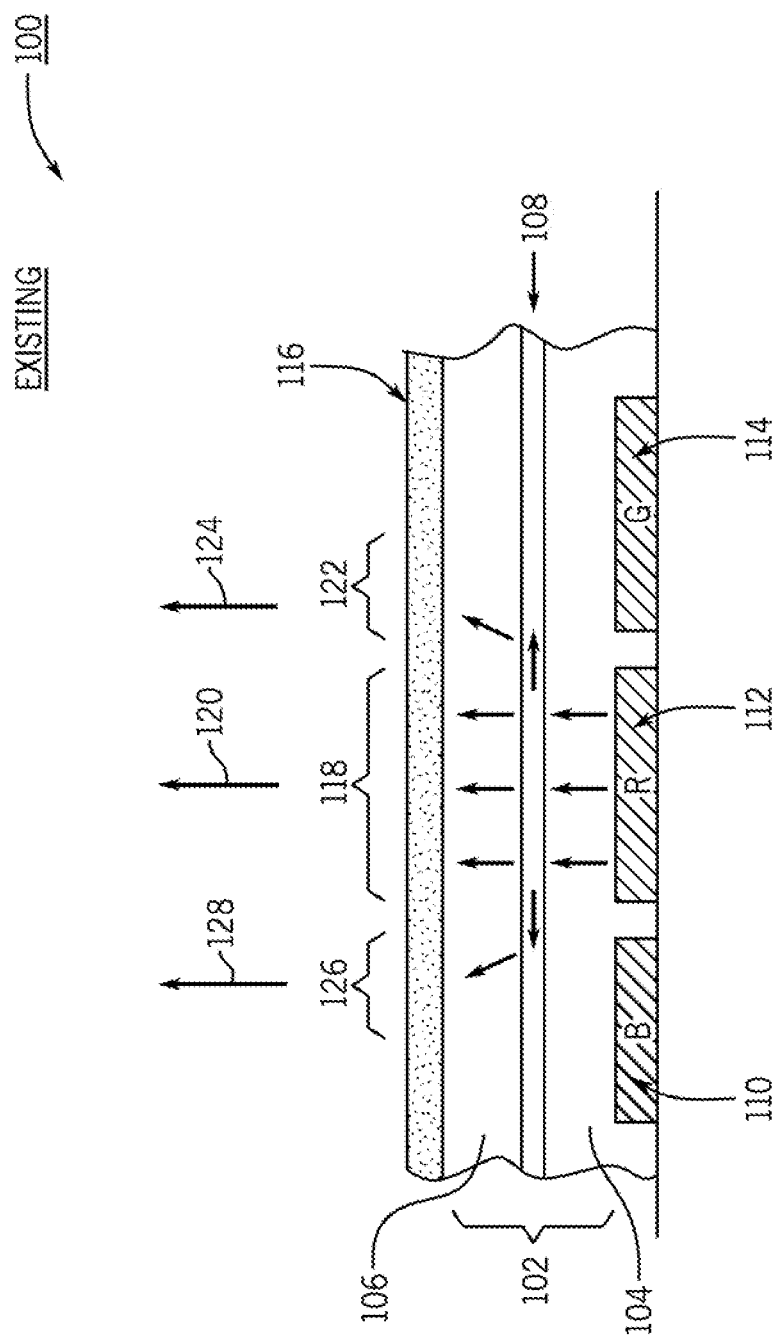
FIG. 1 illustrates an existing two-stack tandem OLED display cross-section.
Figure 2B:
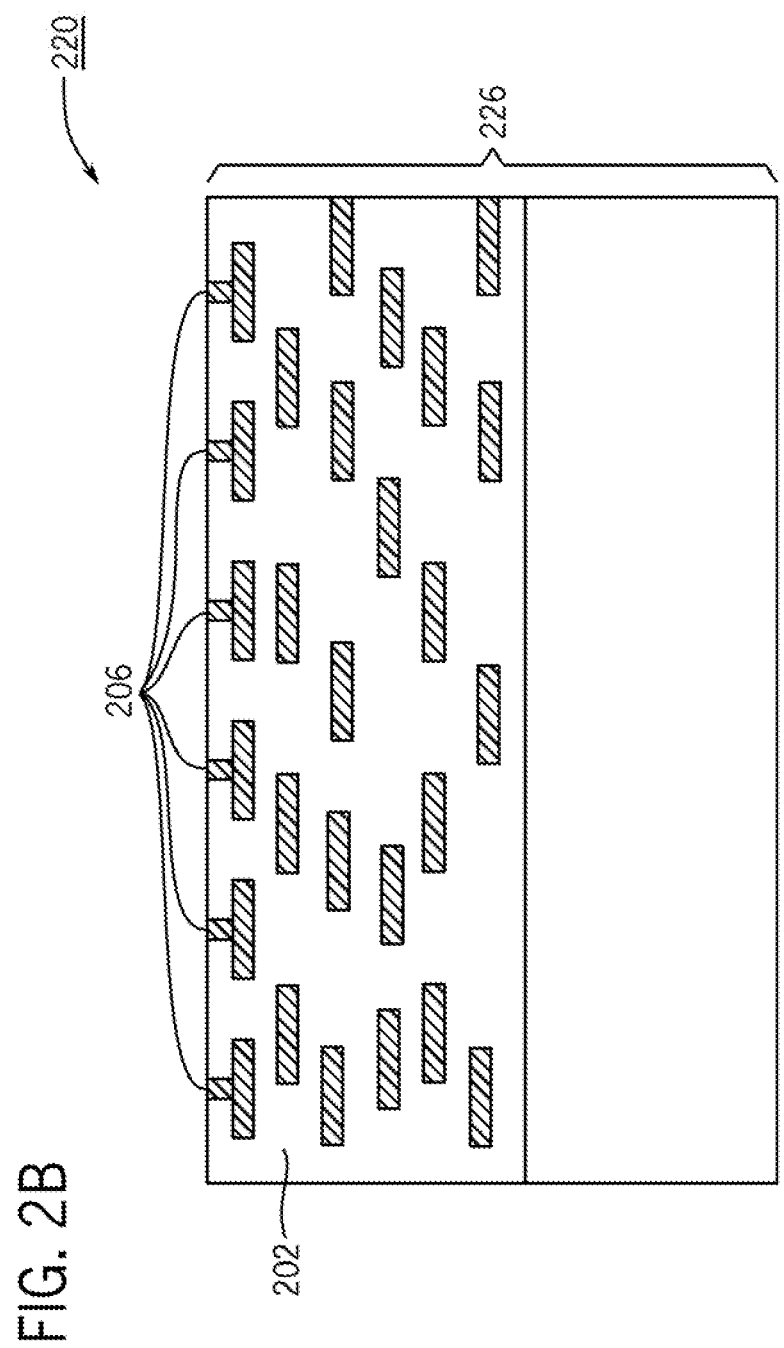
Figure 2C:
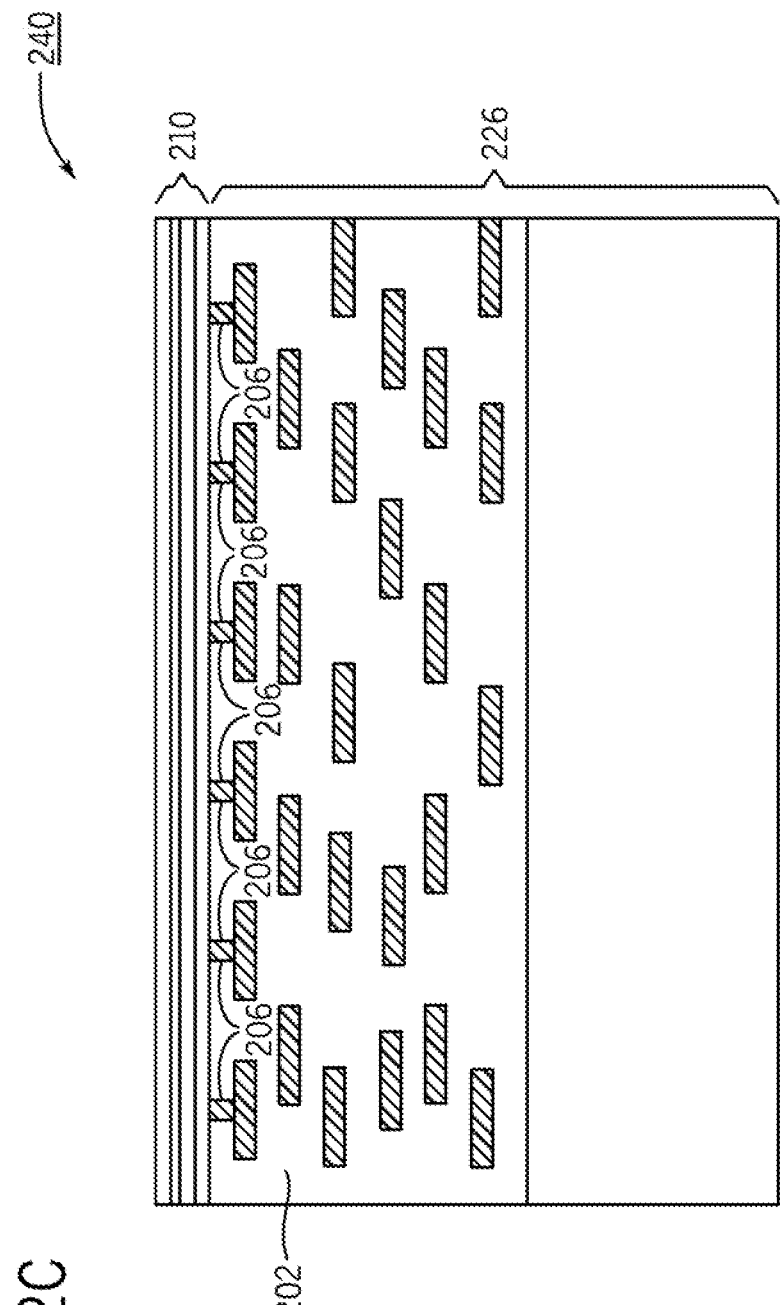
Figure 2D:
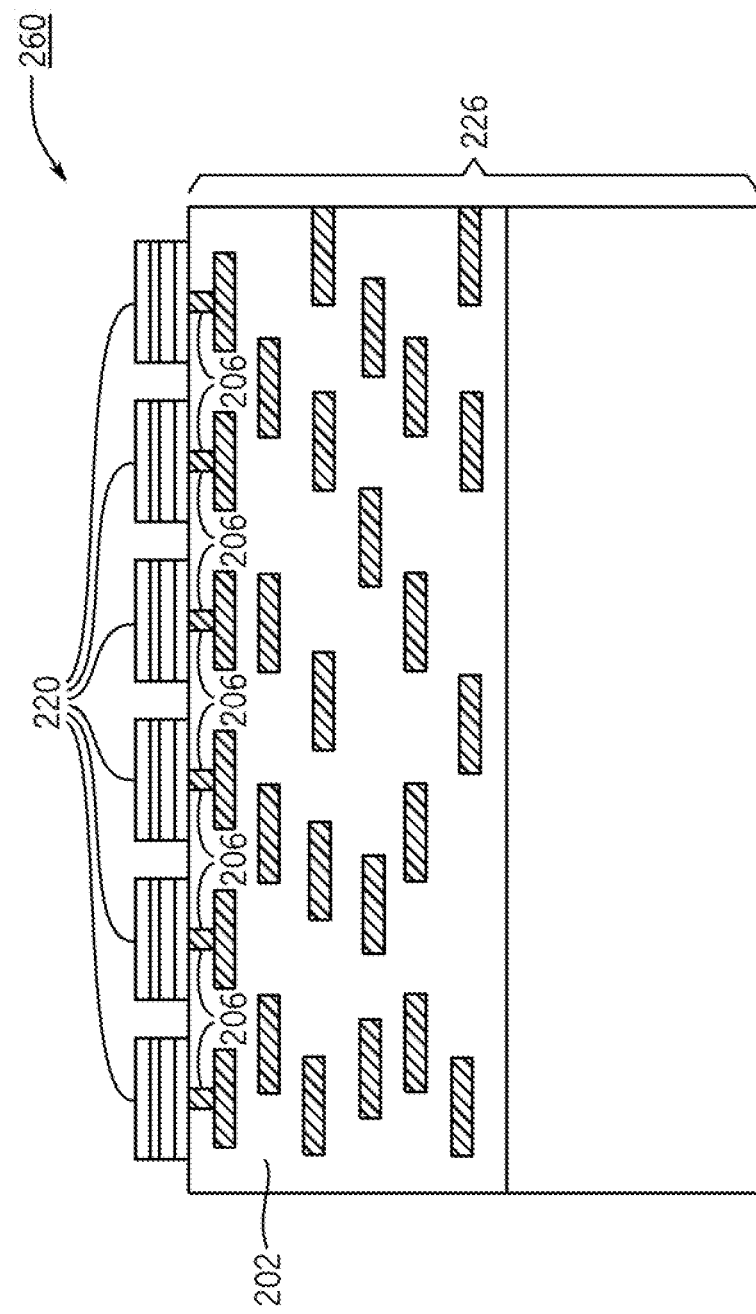

In the following detailed description of embodiments of the invention, reference is made to the accompanying drawings in which like references indicate similar elements, and in which is shown by way of illustration, specific embodiments in which the invention may be practiced. These embodiments are described in sufficient detail to enable those of skill in the art to practice the invention. In other instances, well-known circuits, structures, and techniques have not been shown in detail in order not to obscure the understanding of this description. The following detailed description is, therefore, not to be taken in a limiting sense, and the scope of the invention is defined only by the appended claims.

Apparatuses, methods, and systems are described for providing high brightness OILED displays that produce excellent color purity with both sharp images and wide color gamut. As used in this description of embodiments, display and micro display are to be afforded a broad meaning and can be used interchangeably. Note that embodiments of the invention are applicable to displays of various sizes including micro displays of 1.5 inch or less as measured across a diagonal of the display to large flat panel displays measuring multiple feet across a diagonal of the display. Thus, embodiments of the invention are applicable to displays of any size. Also, as used in this description of embodiments, it will be understood that a pixel of an OLED display can be made from multiple subpixels, where each subpixel is used to contribute a separate color of light to the pixel. Note that the terms; "pixel," "display pixel," "display element," or "OLED device" are used synonymously and all of these terms, i.e., "pixel," "display pixel," "display element," or "OLED device" are to be distinguished from "subpixel." In addition, one or more OLED pixels will be described in the figures that follow for clarity in the illustrations, however it will be understood that such descriptions extend to an entire display having many display pixels configured in a row and many rows configured to provide displays having a general number of m rows and n columns of OLED display elements on which images are provided to a user.

FIG. 2A-2D illustrates various cross-sections corresponding to process steps during the creation of subpixel anodes, according to embodiments of the invention. With reference to FIGS. 2A-2D collectively, in various embodiments, micro OLED displays are fabricated using Silicon (Si) semiconductor fabrication techniques for a backplane of a display. When Si fabrication techniques are utilized for the backplane it is often desirable to use an anode material that is commonly used in Si integrated circuit processing. In various embodiments, an anode is made utilizing a thin layer of Titanium Nitride (TiN) over Aluminum (Al). TiN has a high work function (~4.6 eV), similar to that of Indium Tin Oxide (ITO) (~4.5 eV), therefore facilitating hole injection. If the TiN film is made thin enough, such as 3 nanometers (nm), the reflectivity of TiN/Al can be very high, close to ninety percent (90%) thereby providing a high emission efficiency. OLED devices using a TiN/Al anode are achieved with good performance in terms of low OLED diode voltage and high OLED current efficiency.

In one or more embodiments, a method to form a TiN anode, such as illustrated in any of figures herein includes:

1. Typical Complementary Metal-Oxide-Semiconductor (CMOS) processing is used to fabricate the backplane integrated circuits on Si to drive the OLED displays. This may consist of six metal processing (not including the anode metal), a representative example of which is illustrated at 226.

2. On top of this processed wafer, the anode metal processing is performed. A thick dielectric layer 202, such as Silicon Dioxide ($SiO_2$), is deposited above the top metal layer and planarized by a chemical mechanical polishing (CMP) step. "Via" holes 206 are etched in the dielectric layer 202 and filled with metal such as tungsten.

3. In various embodiments, a metal stack consisting of TiN/Al/TiN/Ti (indicated at 218, 216, 214, 212) or TiN/Al/Ti is deposited over the $SiO_2$ as the anode metal layers. Representative metal stacks for the anode are shown at 210. The top TiN thickness is in the range of 2-5 nm. The Al thickness is in the range of 30-60 nm. The bottom TiN/Ti or Titanium (Ti) layer is an adhesion layer to oxide underneath the anode metal layer. Thickness of the bottom TiN is in the range of 5-10 nm and thickness of Ti is in the range of 1-0 nm.

4. The metal stack is then patterned by photolithography and etching into individual anodes for Red (R), Green (G) and Blue (B) subpixels 220.

In various embodiments, existing problems with OLED displays, such as but not limited to; emission efficiency, crosstalk between sub pixels, reduced color gamut, lack of image sharpness, etc. are eliminated by creating a barrier between OLED subpixels together with a multiple-stack OLED structure. For example, a tandem OLED structure consists of two OLED diodes connected in series, where light-emission efficiency as measured by Candela per ampere of current (Cd/A), can be theoretically doubled compared to a single-junction OLED diode. In the two-stack tandem OLED structure, a highly conductive "charge generation layer" (CGL) is usually inserted between the two OLED diodes to minimize the voltage drop between the two diodes when current flows from one diode to the other. Ideally, the voltage of a two-stack tandem OLED should be only twice that of a single-junction OLED. This CGL layer is very important to avoid excess voltage across tandem OLED devices to minimize the OLED power consumption.

Figure 3A:
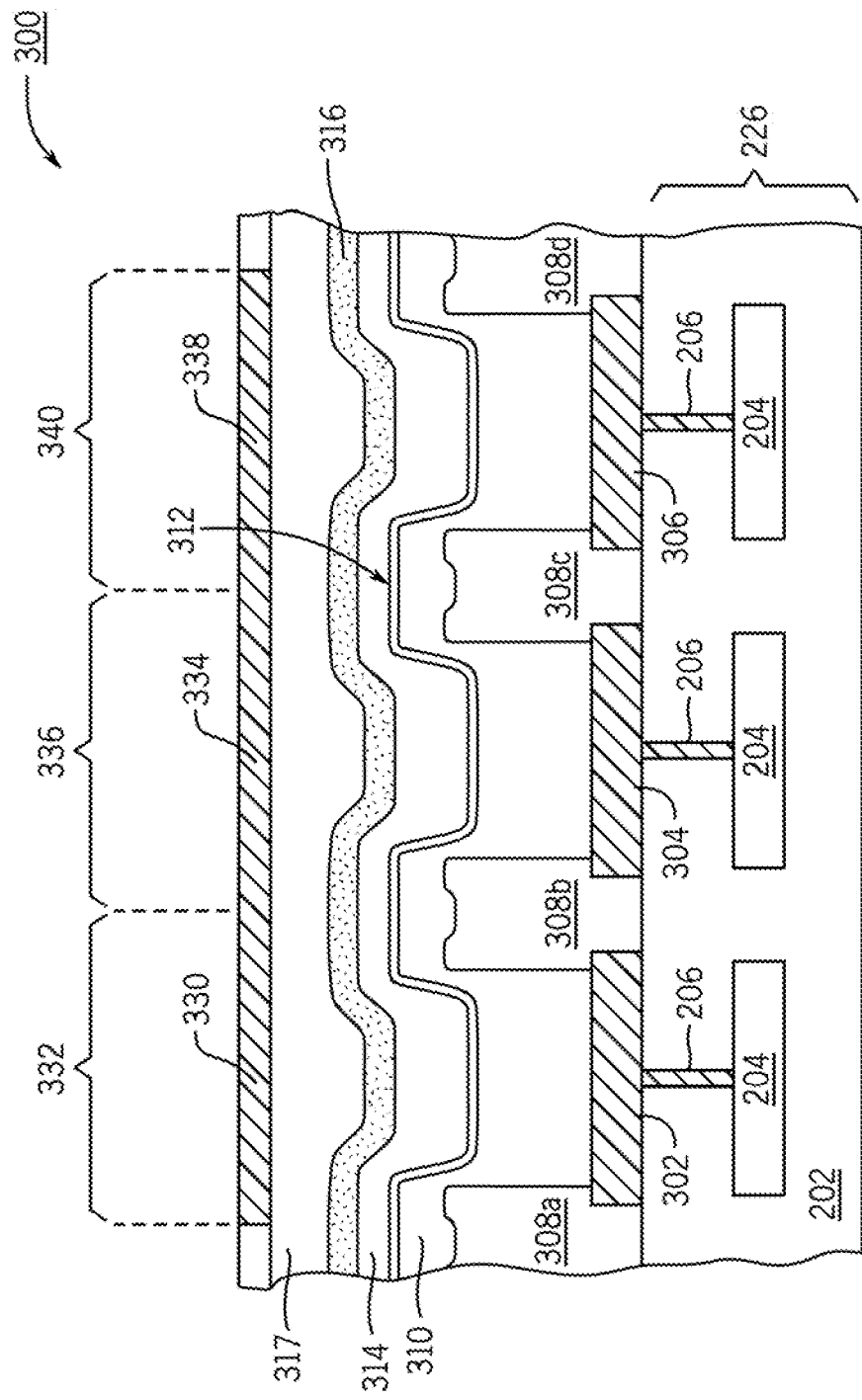
FIG. 3A illustrates, in cross-section, a dielectric barrier, according embodiments of the invention.

FIG. 3A illustrates, in cross-section, generally at 300, a dielectric barrier, according to embodiments of the invention. FIG. 3B illustrates at 350, a detailed view of a portion of FIG. 3A. With reference to FIG. 3A and FIG. 3B together, the resulting cross-section in an OLED device, resulting from a method of building a "barrier" between subpixels to reduce or prevent lateral current flow for tandem or two-stack OLED devices, is illustrated. The two-stack OLED device is made with a first light emitting OLED stack 310, a charge generation layer 312, and a second light emitting OLED stack 314. As shown in FIGS. 3A/3B, a dielectric "barrier" is formed between anodes of each subpixel. Such a structure is formed by dielectric layer deposition followed by masked etching to expose the anode metal. The thickness of dielectric, represented by $h_{DB}$ at 352, is chosen such that it is substantially larger than a thickness, represented by $h_S$ at 354, of the lower OLED stack 310. The thickness range of $h_{DB}$ is 1000 angstroms (Å) to 5000 A, with the preferred range between 1500 A and 3000 A. The CGL layer 312 which is located on top of the lower OLED stack 310 will become severely "nonpanar" over the "barriers" 308a, 308b, 308c, 308d, etc. As a result, the CGL layer 312 can have greatly reduced thickness, as indicated at 358/360 over the "barrier" 308b, relative to a thickness of the CGL at 356, and may become even discontinuous in these regions. These changes in the CGL layer 312 lead to reduced conductance and reduced lateral current flow. Reduced conductance and reduced lateral current flow reduce and/or eliminate crosstalk between subpixels, indicated by 332, 336, and 340 in the OLED structure; thereby, improve image clarity and maintain a proper color gamut. Both of these contribute to high quality image creation on an OLED display.

In various embodiments, methods to create the cross-section illustrated in FIG. 3A proceed as follows:

1. In various embodiments, typical CMOS processing is used to fabricate the backplane integrated circuits (indicated at 226) to drive the OLED display elements. This may consist of six metal processing (not including the anode metal).

2. On top of this processed wafer, the anode metal processing is performed. A thick dielectric layer 202 such as $SiO_2$ is deposited above the top metal layer and planarized by a chemical mechanical polishing (CMP) step. Via holes 206 are etched in the dielectric layer 202 and filled with metal such as tungsten.

3. Individual anodes are fabricated for each subpixel by metal deposition and etching. In one or more embodiments, when a display is based on a red, blue, green, (RBG) color map, with a pixel being implemented with individual subpixels, then each subpixel is used for a particular color, i.e., red, blue, or green, contribution to the given pixel. Thus, the anode metal layer 210 may be the stack consisting of TiN/Al/TiN/Ti or TiN/Al/Ti and is deposited over the $SiO_2$ indicated at 202 (see e.g., FIG. 2A et al.). The anode metal layer is etched between subpixels by photolithography and dry etching to produce the individual subpixel anodes 302, 304, 306, etc.

4. A dielectric layer consisting of SiO2 is deposited over the entire surface. The thickness of the dielectric layer ranges from 100 nm to 500 nm, preferably from 200 nm to 300 nm.

5. In various embodiments, a photo process is used to define the opening above the anodes and etching is then performed to remove the dielectrics to expose the anode metal. The etching may be done by dry etching, wet etching or a combination of dry etching and wet etching. The processing results in dielectric barriers 308b, located between subpixel anodes 302 and 304 and dielectric barrier 308c between subpixel anodes 304, and 306, etc. Similar structure is repeated for the entire row of pixels, of which FIGS. 3A/3B illustrate but a section. Likewise, similar structure is repeated for the plurality of rows of pixels that create the m row by n column display using OLED pixels. Note that each pixel utilizes its own three subpixels to produce the required colors.

As used in this description of embodiments, two light emitting OLED stacks 310 and 314 are used with the CGL layer 312 disposed between 310 and 314. The embodiments taught herein are readily used with existing OLED stacks and CGL layers. A non-limiting example of an OLED stack, used only for illustration, and with no limitation implied thereby is a stack made with layers that include; a hole injection layer, a hole transport layer, an emitting layer with host dopants, an electron transport layer. The OLED stack 310 may emit primarily at one color such as red or two colors such as red and green. The OLED stack 314, may emit primarily at another color such as blue or two colors such as green and blue. The overall emission from the two OLED stacks 310 and 314 emit in broad spectrum resembling white color. A non-limiting example of a CGL layer used only for illustration, and with no limitation implied thereby is a CGL made with an n-doped organic material and a p-doped organic material, such as Li:tris(8-quinolinolato) aluminum (III)(Alq3)/FeCl3:4,4'-N,N'-bis[N-(1-naphthyl)-N-phenylamino]biphenyl (NPB), and 4,7-diphenyl-1,10-phenanthroline (BPhen):Rb2CO3/NPB:ReO3.

In various embodiments, more than two OLED stacks are used, for example, triple light emitting OLED stacks are connected in series via two CGL layers. In this case, each OLED stack may emit primarily at one wavelength such as red, green, and blue. Alternatively, one OLED stack may emit primarily at two wavelengths such as red and green and two stacks may emit primarily at blue wavelength.

In various embodiments, for OLED displays, the contact to the cathode 316 is made from a cathode ring contact located at the outer surrounding of the display (not shown). During emission, the electrons are transported to the pixel area via the cathode layer. Because of the big undulation of the device structure, which results from the dielectric barriers, a thin metal cathode layer made of Silver (Ag) or Silver/Magnesium (Ag/Mg) may not be continuous across the tall dielectric barriers 308a, 308b, 308c, 308d, etc. On the other hand, a thicker cathode made of transparent conducting materials such as indium tin oxide (ITO) may form a continuous layer, but its conductance may not be high enough, which may introduce a substantial voltage drop at the center of the display if the display is bigger than 0.5 inch diagonal in size. A lower effective voltage at the center of the display will lower the brightness of the display in the area and the uniformity across the display area will become worse. A cathode 316 consisting of a combination of a thin layer of metal (Ag or Ag/Mg) and a thicker layer of transparent oxide layer (ITO or InZnO) can be used to overcome the problem. In various embodiments, a layer 317 is needed to protect the OLED layers from moisture penetration since the OLED layers are very susceptible to damage to water. The layer 317 may include dielectric layers such as silicon nitride or zirconium oxide deposited by atomic layer deposition or chemical vapor deposition and it may also include an additional organic layer. On top of 317, color filters 330, 334, and 338 are fabricated. As described above the OLED stacks 310 and 314 emit white light.

Color filters 330, 334, and 338 filter the white light accordingly and emit light of their specific color. In a non-limiting example, provided merely for illustration in one or more embodiments, typical color filters are made by using photo patterning of photosensitive pigmented material. The material is generally a negative tone photoresist with special color pigment (such as R, G, B) mixed in. In addition, a clear material without pigment is also used as an underlayer material for adhesion improvement and/or an overlayer material for protection of color filter layers. Processing of color filters can include the following steps:

1. Spin on clear photosensitive material, prebake, expose with UV light to convert the material into a stable layer, and perform post bake. A typical post bake temperature is 100° C.

2. Spin on photosensitive material with blue pigment, prebake, use a photo mask for blue subpixel patterns to expose the material, develop with solvent to remove the unexposed material, post UV curing and post bake.

3. Spin on photosensitive material with blue pigment, prebake, use a photo mask for green subpixel patterns to expose the material, develop with solvent to remove the unexposed material, post UV curing and post bake.

4. Spin on photosensitive material with blue pigment, prebake, use a photo mask for red subpixel patterns to expose the material, develop with solvent to remove the unexposed material, post UV curing and post bake.

5. Spin on clear photosensitive material, prebake, expose with UV light to convert the material into a stable layer, and post bake.

For a display created with a red, green, blue (RGB) color map, in one embodiment, the color filter 330 filters the OLED emitted white light to provide an output of visible blue light; the color filter 334 filters the OLED emitted white to provide an output of visible red light; and the color filter 338 filters the OLED emitted white light to provide an output of green light. Each of the colored subpixels, 332, 336, and 340 provide their respective colored light contributions to the given display pixel of which they are a part. In operation, the user observes the output of the display pixel and perceives the overall color of the display pixel. The dielectric barrier provides accurate color generation at the display pixel level by initially providing accurate R, G, and B contributions from the subpixels to an OLED display pixel. In operation, when current flows to a desired sub-pixel of the three sub-pixels of any display element, lateral current flow through the charge generation layer (CGL) to adjacent sub-pixels is impeded, resulting in light generation by the desired sub-pixel and reduction in unwanted light generation at sub-pixels adjacent to the desired sub-pixel. The described structure results in accurate reproduction of desired colors by an OLED display.

Figure 4A:
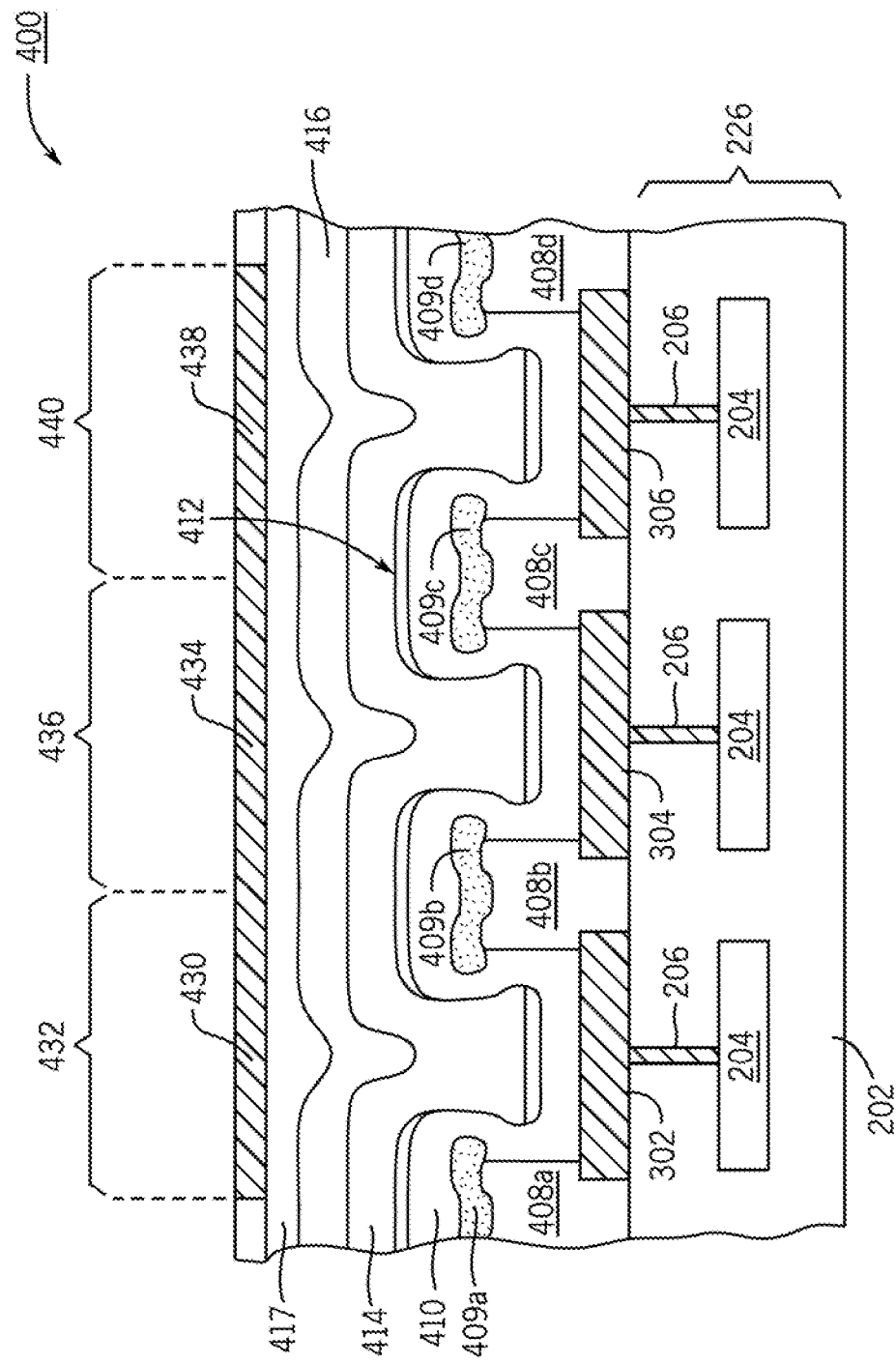
FIG. 4A illustrates, in cross-section, another dielectric barrier, according embodiments of the invention.
Figure 4B:
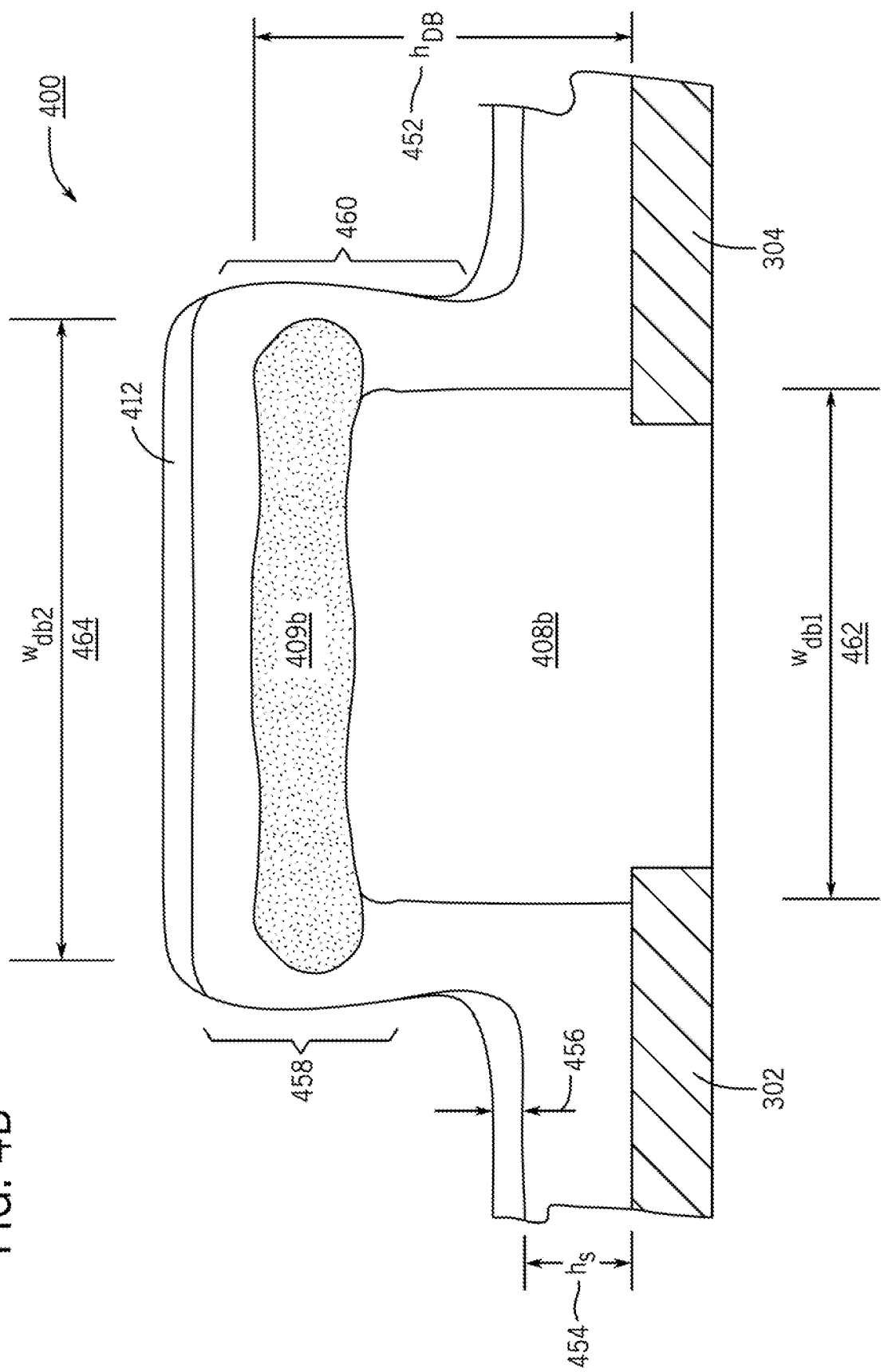
FIG. 4B illustrates, in cross-section, an enlarged view of a portion of the dielectric barrier from FIG. 4A, according embodiments of the invention.

FIG. 4A illustrates, generally at 400, in cross-section, another dielectric barrier, according embodiments of the invention. FIG. 4B illustrates at 450, a detailed view of a portion of FIG. 4A. With reference to FIG. 4A and FIG. 4B together, the resulting cross-section in an OLED device, resulting from a method of building a "barrier" between subpixels to reduce or prevent lateral current flow for two-stack OLED devices, is illustrated. The two-stack OLED device is made with a first white light emitting OLED stack 410, a charge generation layer 412, and a second white light emitting OLED stack 414. As shown in FIGS. 4A/4B, a dielectric "barrier" is formed between anodes of each subpixel. Such a structure is formed by dielectric layer deposition followed by masked etching to expose the anode metal. The thickness of dielectric, represented by $h_{DB}$ at 452, is chosen such that it is larger than a thickness, represented by $h_S$ at 454, of the lower OLED stack 410. Thus, $h_{DB}$ is greater than $h_S$. The CGL 412 which is located on top of the lower OLED stack 410 will become severely "nonplanar" over the "barriers" 408a/409a, 408b/409b, 408c/409c, 408d/409d, etc. As a result, the CGL 412 can have greatly reduced thickness, as indicated at 458/460 over the "barrier" 408b/409b and become discontinuous in these regions, relative to a thickness 456 of the CGL over the anode 302. These changes in the CGL 412 lead to reduced conductance and reduced lateral current flow to adjacent subpixels. Reduced conductance and reduced lateral current flow reduce and/or eliminate crosstalk between subpixels, indicated by 432, 436, and 440 in the OLED structure; thereby, improving image clarity and maintaining a proper color gamut. Both of which contribute to high quality image creation on an OLED display.

In various embodiments, methods to create the cross-section illustrated in FIGS. 4A-4B proceed as follows:

1. Note that the shape of the barrier in FIGS. 4A-4B is different from the shape of the barrier in FIGS. 3A-3B, in that the barriers in FIG. 4A-4B are wider on the top, similar to a "mushroom" shape. As illustrated at 450 in FIG. 4B, a width $w_{db2}$ of the upper barrier 409b is wider than a width $w_{db1}$ of the lower portion 408b of the barrier. Therefore, $w_{db2}$ is greater than $w_{db1}$.

2. The dielectric layer for the barrier is formed by depositing $SiO_2$ followed by SiN on the top. The thickness of $SiO_2$ ranges from 100 to 500 nm and thickness of SiN ranges from 10 to 100 nm.

3. After the $SiO_2$/SiN dielectric layer is etched, typically by dry etching, a subsequent wet etching is performed using oxide etching chemical, such as buffered hydrogen fluoride (BHF) or diluted HF, to "undercut" the oxide while SiN top layer remains largely unetched, thereby producing the shape with a wider upper region and a narrower lower region.

4. This "mushroom" shape barrier, i.e., 408a/409a, 408b/409b, 408c/409c, 408d/409d, etc. is very effective in reducing the thickness of CGL 458/460 over the dielectric barrier and thereby rendering the CGL discontinuous such as in regions 458, 460 and elsewhere wherever the CGL traverses over a dielectric barrier fabricated between adjacent sub-pixel anodes.

In various embodiments, for OLED displays, the contact to the cathode 416 is made from cathode ring contact located at the outer surrounding of the display (not shown). During emission, the electrons should be transported to the pixel area via the cathode layer. Because of the big undulation of the device structure, which results from the dielectric barrier, a thin metal cathode layer made of Silver (Ag) or Silver/Magnesium (Ag/Mg) may not be continuous across the tall barriers, e.g., 408a/409a, 408b/409b, 408c/409c, 408d/409d, etc. On the other hand, a thicker cathode made of transparent conducting materials such as ITO may form a continuous layer, but its conductance may not be high enough, which may introduce a substantial voltage drop at the center of the display if the display is bigger than 0.5 inch diagonal in size. A lower effective voltage at the center of the display will lower the brightness of the display in the area and the uniformity across the display area will become worse. A cathode consisting of a combination of a thin layer of metal (Ag or Ag/Mg) and a thicker layer of transparent oxide layer (ITO or InZnO) can be used to overcome the problem.

The layers above the cathode 416 follow the order and methods described above in conjunction with FIG. 3A and FIG. 3B. For example, in various embodiments, a passivation layer 417 and color filters 430, 434, and 438 are fabricated over the cathode 416. As described above, the first and second OLED stacks 410 and 414 are white light emitting structures. Color filters 430, 434, and 438 filter the white light accordingly and emit light of their specific color. Typical color filters are fabricated at 430, 434, 438 as described above in conjunction with FIG. 3A and FIG. 38. For a display created with a red, green, blue (RGB) color map, in one embodiment, the color filter 430 filters the OLED emitted white light to provide an output of visible blue light; the color filter 434 filters the OLED emitted white to provide an output of visible red light; and the color filter 438 filters the OLED emitted white light to provide an output of green light. Each of the colored subpixels, 432, 436, and 440 provide their respective colored light contributions to the given display pixel of which they are a part. In operation, the user observes the output of the display pixel and perceives the overall color of the display pixel. The dielectric barrier provides accurate color generation at the display pixel level by initially providing accurate R, G, and B contributions from the subpixels of an OLED display pixel. In operation, when current flows to a desired sub-pixel of the three sub-pixels of any display element, lateral current flow through the charge generation layer (CGL) to adjacent sub-pixels is impeded, resulting in light generation by the desired sub-pixel and reduction in unwanted light generation at sub-pixels adjacent to the desired sub-pixel. The described structure results in accurate reproduction of desired colors by an OLED display.

Figure 5:
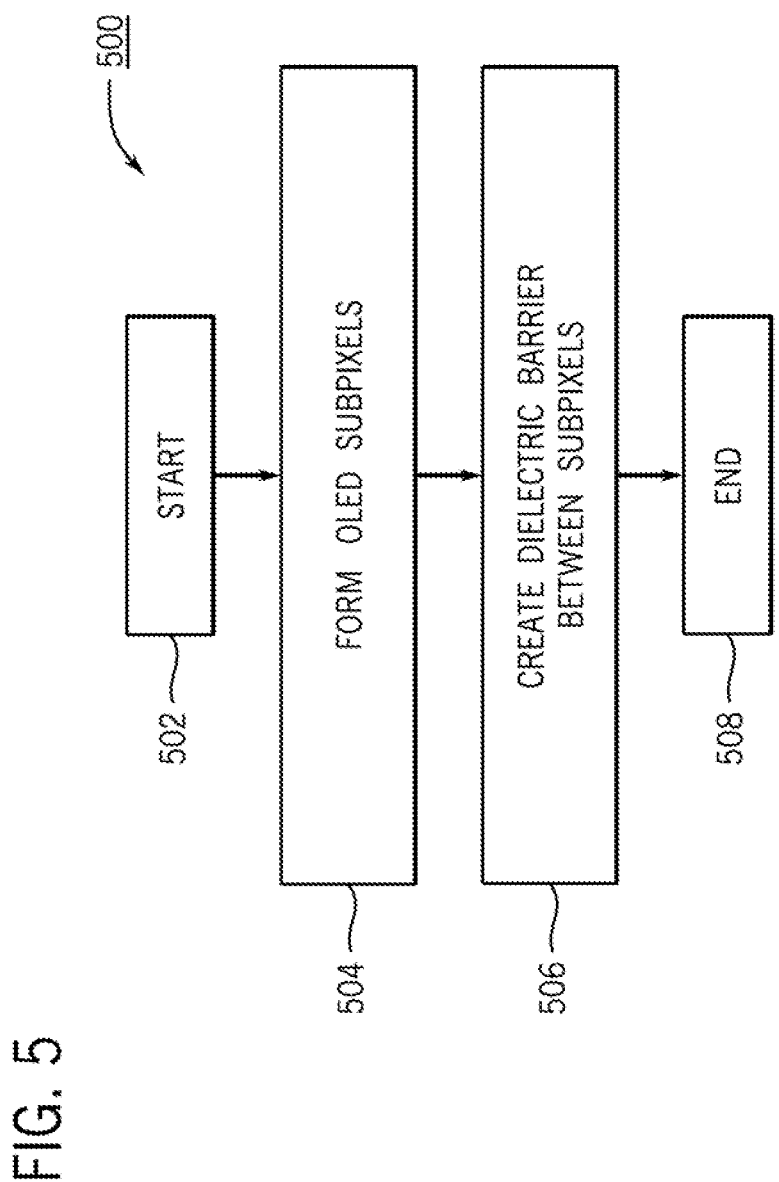
FIG. 5 illustrates, a process of improving an image rendered on an OLED display through microstructure fabrication, according embodiments of the invention.

FIG. 5 illustrates, generally at 500, a process of improving an image rendered on an OLED display through microstructure fabrication, according embodiments of the invention. With reference to FIG. 5, a process begins at a block 502. At a block 504 OLED subpixels are fabricated. Fabrication of subpixels for an OLED display is described herein in conjunction with various figures, such as, but not limited to, FIG. 2A through FIG. 4B. In various embodiments the OLED subpixels are fabricated using silicon processing techniques. At a block 506 dielectric barriers are created between subpixels. In various embodiments, creation of dielectric barriers between subpixels is described herein in conjunction with various figures, such as, but not limited to, FIG. 3A through FIG. 4B. A process ends at a block 508.

The light emitted from the OLED stacks and output from the color filter typically has a broad output angle greater than plus or minus fifty (50) degrees. Above each color filter a refractive micro lens element is added by micro fabrication so that the light output can be increased and "collimated" into a narrower angle. The efficiency of the light collimation depends on light coupling efficiency between the color filter (CF) and the micro lens interface as well as a shape of the micro lens.

Figure 6:
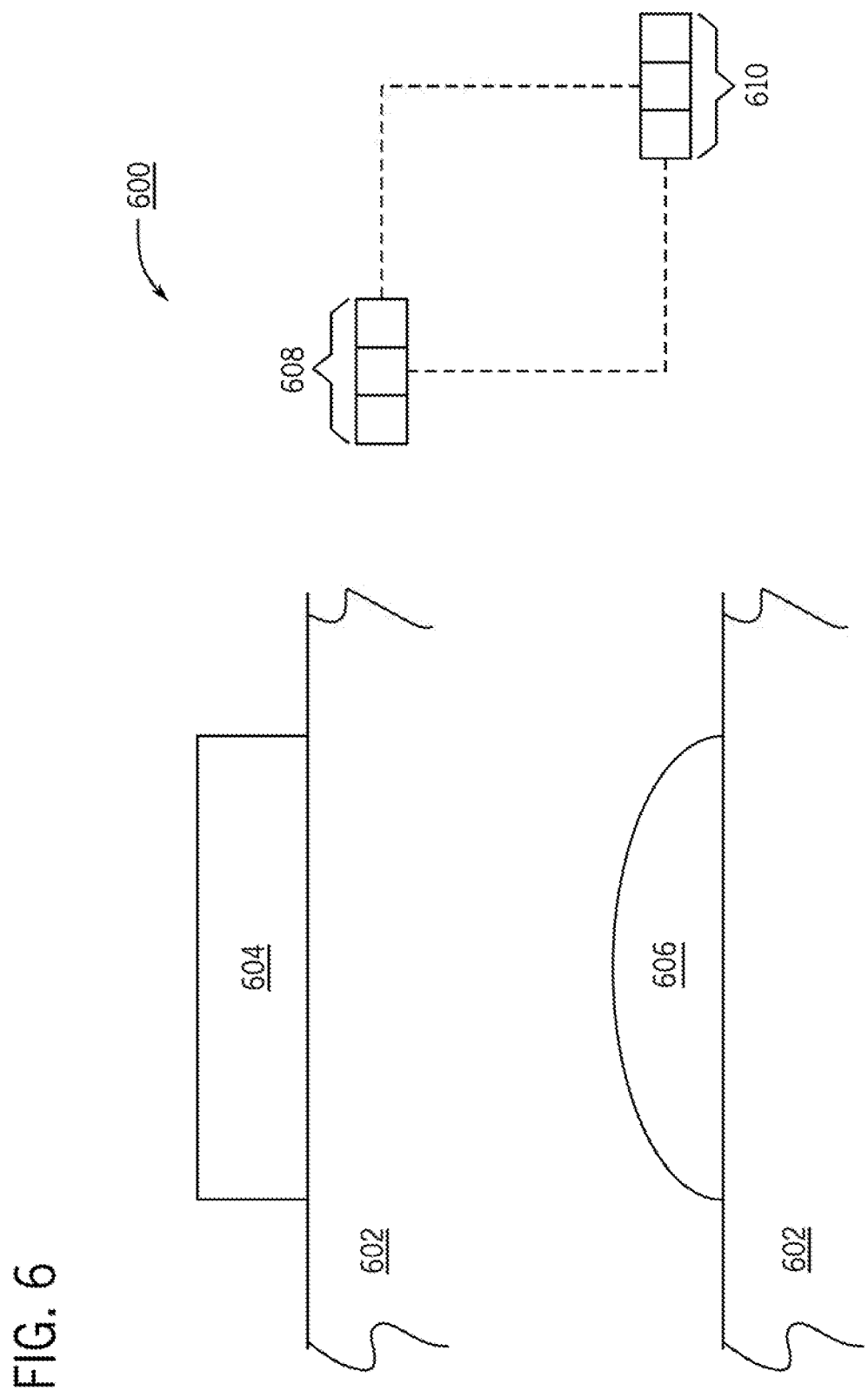
FIG. 6 illustrates, in cross-section, micro lens fabrication for subpixels in an OLED display, according embodiments of the invention.

FIG. 6 illustrates, in cross-section, generally at 600, micro lens fabrication for subpixels in an OLED display, according embodiments of the invention. With reference to FIG. 6, in various embodiments, micro lens fabrication can be accomplished with a heat flow method or an etch back method. In the heat flow method, the lens base material has a photoresist function. The lens material includes acrylic resin with photo initiator to make it photosensitive. After patterning the lens base material into a shape with sharp side walls, as indicated at 604, it is transformed into a lens shape with post curing at a high temperature. It is desirable for the post curing temperature to be lower than 120° C., and preferably lower than 100° C. An example of the post cured lens shape is illustrated qualitatively at 606 merely for illustration. The lens base material is fabricated over surface 602 by photolithography and development, similar to the color filter process described above.

Alternatively, an etch back method can be used to fabricate the lens above the color filter. In various embodiments, with the etch back method, the lens base material does not have a photoresist function, therefore, higher refractive index material can be utilized for the lens. The fabrication process proceeds as follows:

1. A lens material is first coated onto a surface of the OLED microstructure 602 above the color filter;
2. A photo resist material is coated onto the lens material and formed into a square pattern through exposure and development. A heat flow process is used to make the pattern rounded.

Thereafter the lens material under the photoresist is etched using dry etching technique. By purposely adjusting the etching rates of the photoresist and lens material, a lens shape 606 is formed in the micro lens.

Following the description of techniques above, an array of micro lenses is fabricated for a micro display having M rows and n columns. Such a display is illustrated generally by pixel$_{1,1}$ represented at 608 through pixel$_{m,n}$ represented at 610. In various embodiments, OLED displays are made with a general number of m rows and n columns. Note that m and n can have the same value or can have different values. Accordingly, displays can be made with values for m and or n that are less than 2560, equal to 2560, or greater than 2560.

Figure 7:
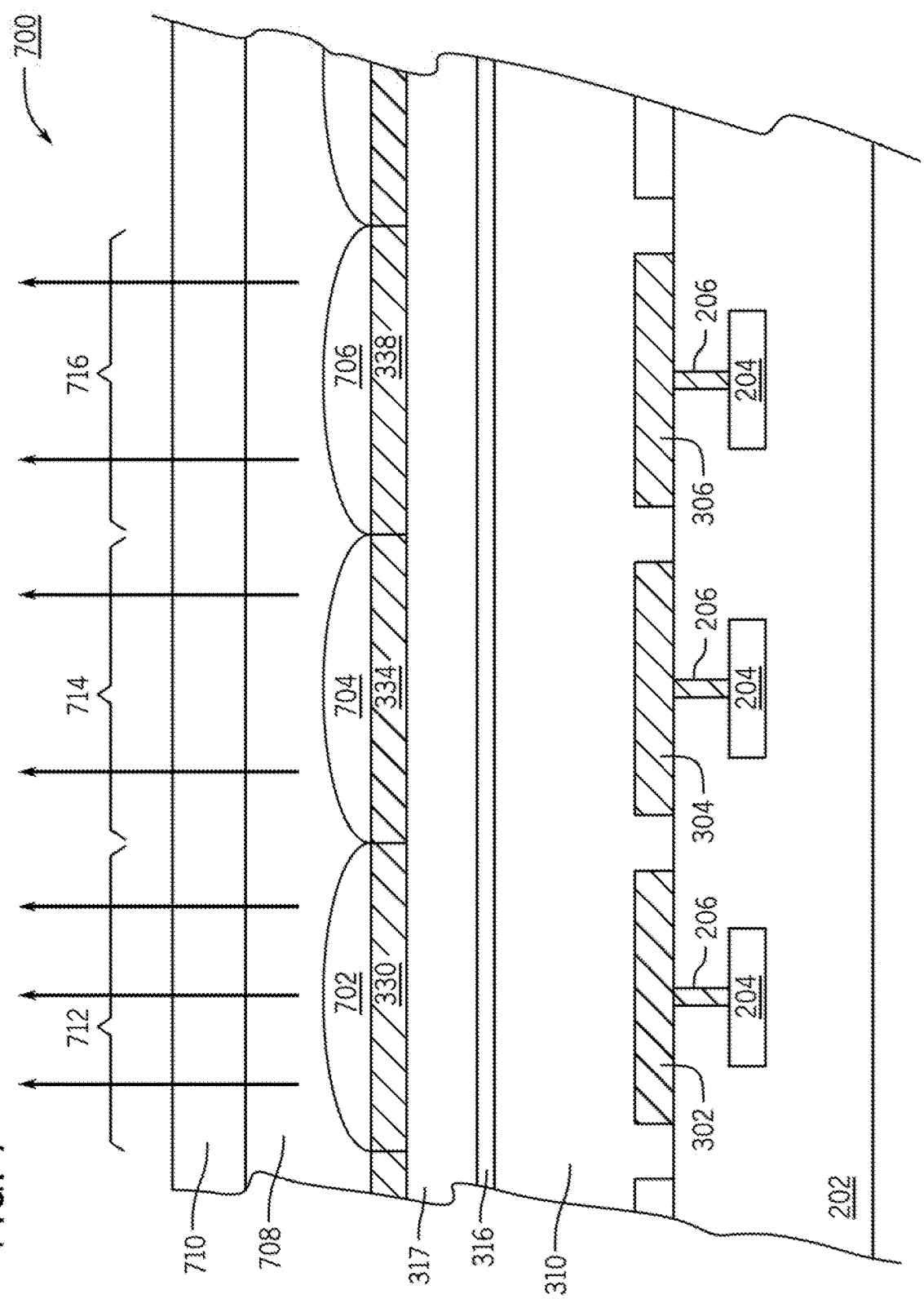
FIG. 7 illustrates, in cross-section, micro lens fabrication for subpixels in a single stack OLED display, according embodiments of the invention.

FIG. 7 illustrates, in cross-section, generally at 700, micro lens fabrication for subpixels in a single stack OLED display, according embodiments of the invention. With reference to FIG. 7, micro lenses 702, 704, 706, etc. are fabricated over color filters 330, 334, 338, etc. in an OLED display. As before, in this description of embodiments, one pixel with its three subpixels is used for clarity of illustration. The OLED device contains a white light emitting OLED single stack 310 which is fabricated over subpixel anodes 302, 304, 306, etc. A common cathode is indicated at 316.

To achieve maximum light output from the OLED display, a vacuum cavity or cavity filled with an inert gas is used above the micro lenses 702, 704, 706, etc. Such a cavity is indicated at 708. In various embodiments, the cavity 708 can be filled with an inert gas or a vacuum can be created. Alternatively the micro lenses can be fabricated using a material with a higher refractive index (approximately 1.6 or higher) and a resin with a lower refractive index (approximately 1.5 or lower) is used to fill the gap between the micro lens and the cover 710. The cover 710 is made from a transparent material, such as, but not limited to glass. In operation, light emitted from the subpixels 712, 714, 716, etc. is collimated by the structures above the color filters (various combinations of micro lenses and gap filling materials in various embodiments) to increase OLED display brightness.

Figure 8:
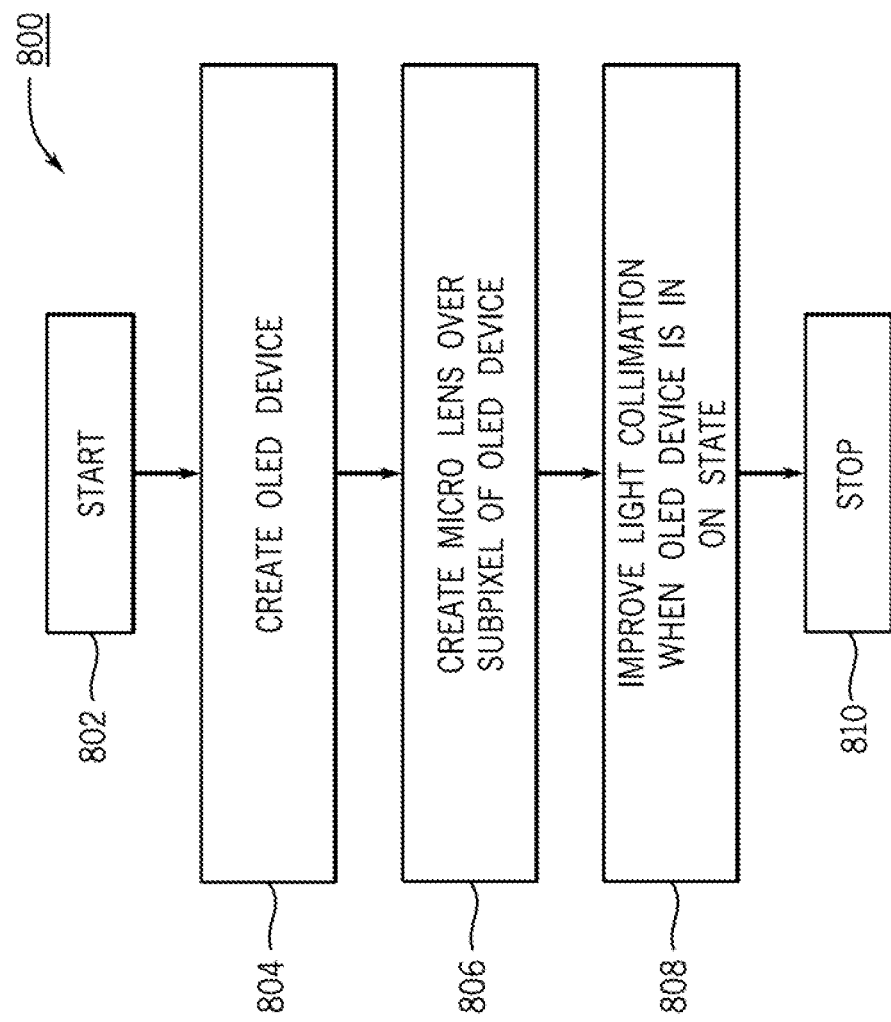
FIG. 8 illustrates, a process of improving light collimation from an OLED display, according embodiments of the invention.

FIG. 8 illustrates, generally at 800, a process of improving light collimation from an OLED display, according embodiments of the invention. With reference to FIG. 8, a process starts at a block 802. At a block 804 an OLED device is created. In various embodiments, the OLED device can be fabricated using a single stack white light emitting OLED, or a tandem stack of white light emitting OLED layers. Note that the micro lens fabrication can be applied to any of the OLED microstructures that include a dielectric barrier (FIG. 3A through FIG. 4B) as well as OLED microstructures that do not include a dielectric barrier. At a block 806 the array of micro lenses is created over the OLED devices fabricated at the block 804. When the OLED device is in an "ON" state the collimation of light output of OLED display increases the brightness of the display to a user. The process stops at a block 810.

Figure 9:
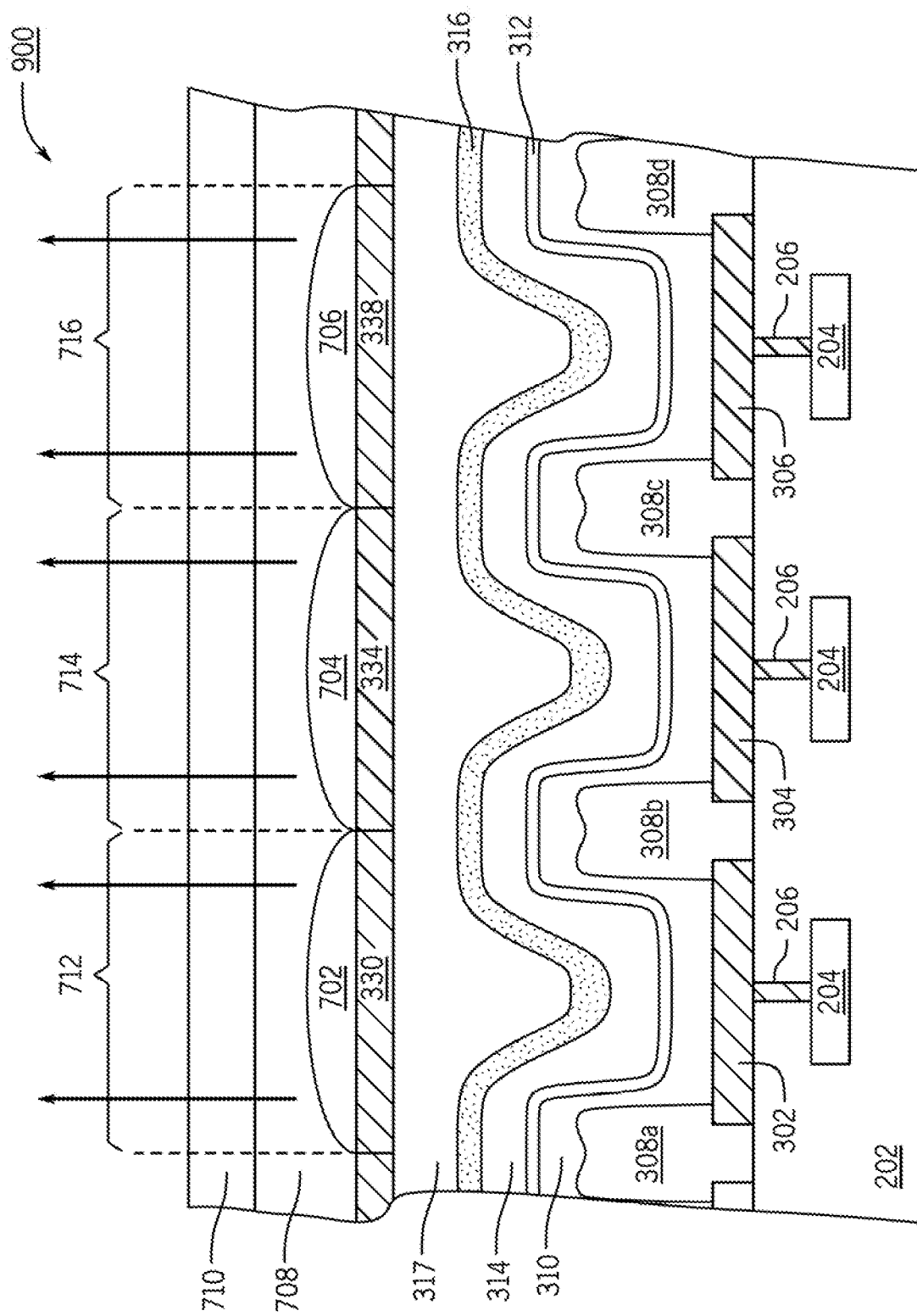
FIG. 9 illustrates, in cross-section, combining micro lenses for subpixels with the dielectric barrier described in FIG. 3A and FIG. 3B in an OLED display, according embodiments of the invention.

FIG. 9 illustrates, in cross-section, generally at 900, combining micro lenses for subpixels with the dielectric barrier described in FIG. 3A and FIG. 3B in an OLED display, according embodiments of the invention. With reference to FIG. 9, the micro lens fabrication described above is combined with the OLED microstructure described in FIG. 3A and FIG. 3B. The resulting OLED structure combines the benefits of increasing color purity through application of dielectric barriers and increasing display intensity through increased collimation of output light. Thereby providing an OLED display that produces images that are clear, color pure, and bright.

Figure 10:
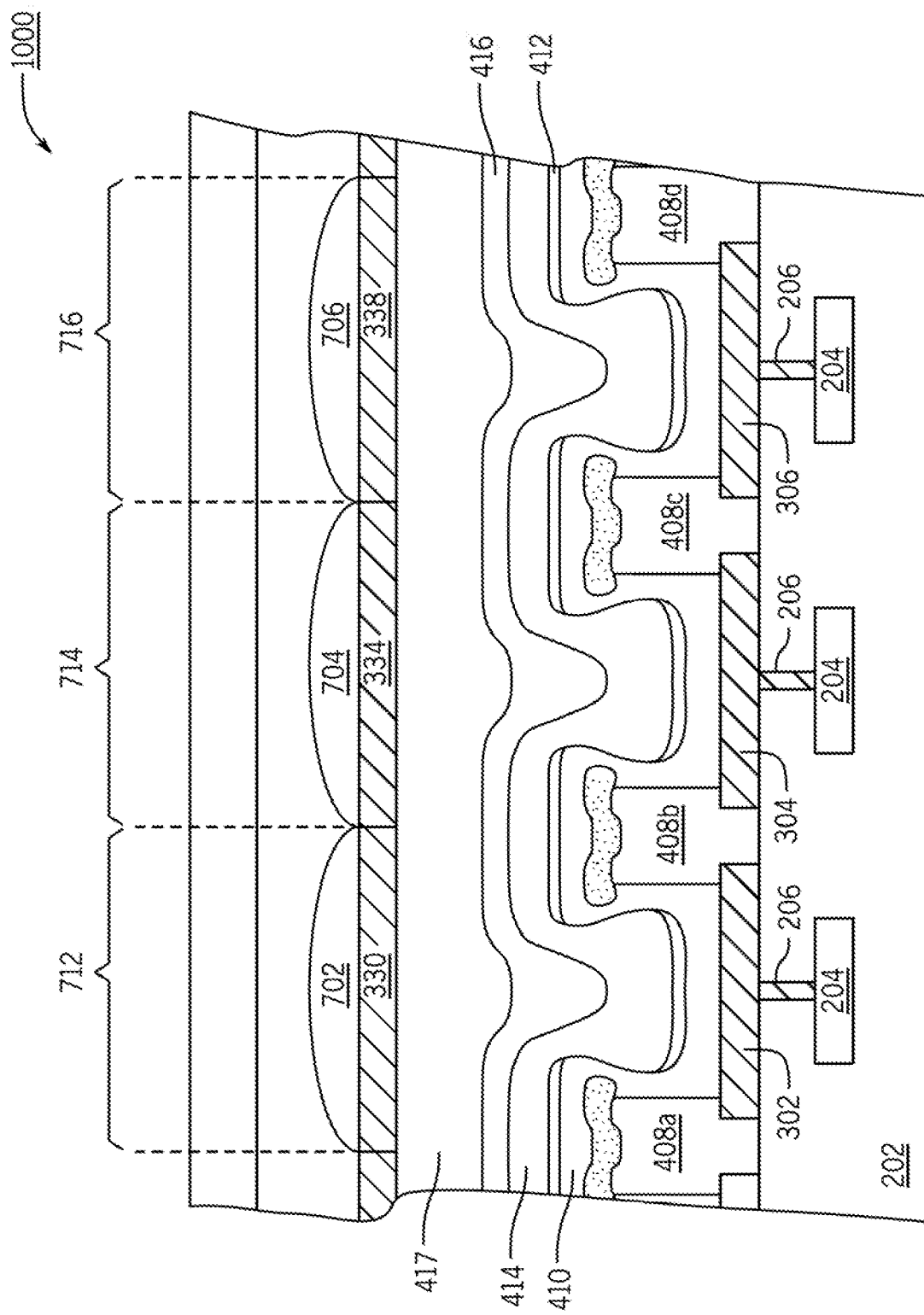
FIG. 10 illustrates, in cross-section, combining micro lenses for subpixels with the dielectric barrier described in FIG. 4A and FIG. 4B in an OLED display, according embodiments of the invention.

FIG. 10 illustrates, in cross-section, generally at 1000, combining micro lenses for subpixels with the dielectric barrier described in FIG. 4A and FIG. 4B in an OLED display, according embodiments of the invention. With reference to FIG. 10, the micro lens fabrication described above is combined with the OLED microstructure described in FIG. 4A and FIG. 4B. The resulting OLED structure combines the benefits of increasing color purity through application of dielectric barriers and increasing display intensity through increased collimation of output light. Thereby providing an OLED display that produces images that are clear, color pure, and bright.

Figure 11:
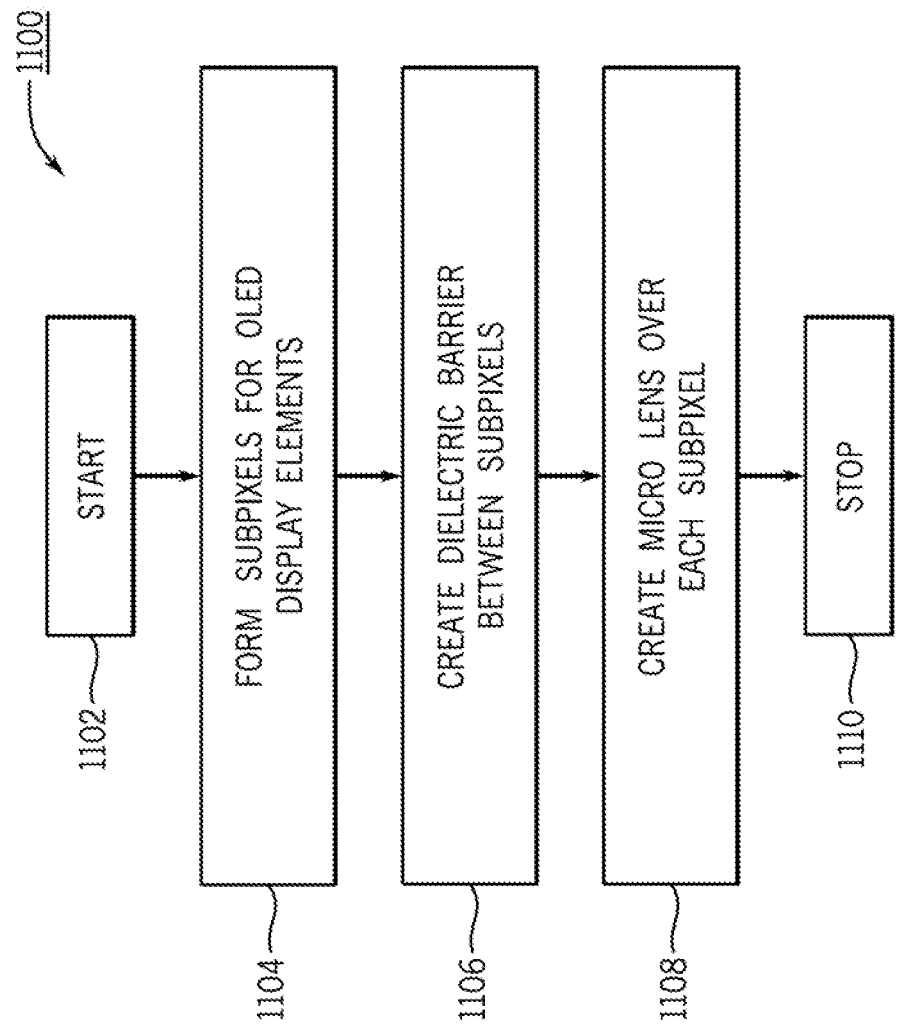
FIG. 11 illustrates, a process of improving image quality and brightness from an OLED display, according embodiments of the invention.

FIG. 11 illustrates, generally at 1100, a process of improving image quality and brightness from an OLED display, according embodiments of the invention. With reference to FIG. 11, a process begins at a block 1102. At a block 1104 OLED subpixels are fabricated. Fabrication of subpixels for an OLED display is described herein in conjunction with various figures, such as, but not limited to, FIG. 2A through FIG. 4B. In various embodiments, the OLED subpixels are fabricated using silicon processing techniques. At a block 1106 dielectric barriers are created between subpixels. In various embodiments, creation of dielectric barriers between subpixels is described herein in conjunction with various figures, such as, but not limited to, FIG. 3A through FIG. 4B. OLED processing steps are performed including the OLED layer deposition, cathode layer formation, passivation, and color filter step.

At a block 1108 an array of micro lenses is created over the OLED devices that were the subject of the processing in blocks 1104 and 1106. A process ends at a block 1110. When the OLED device is in an "ON" state the collimation of light output from the OLED display is increased thereby improving the brightness of the display to a user. The process of FIG. 11 provides an OLED display that produces images that are clear, color pure, and bright.

In various embodiments, the components of the OLED systems as well as the OLED systems described in the previous figures are implemented in an integrated circuit device, which may include an integrated circuit package containing the integrated circuit. In some embodiments, the components of systems as well as the systems are implemented in a single integrated circuit die. In other embodiments, the components of systems as well as the systems are implemented in more than one integrated circuit die of an integrated circuit device which may include a multi-chip package containing the integrated circuit.

For purposes of discussing and understanding the embodiments of the invention, it is to be understood that various terms are used by those knowledgeable in the art to describe techniques and approaches. Furthermore, in the description, for purposes of explanation, numerous specific details are set forth in order to provide a thorough understanding of the embodiments of the present invention. It will be evident, however, to one of ordinary skill in the art that embodiments of the present invention may be practiced without these specific details. In some instances, well-known structures and devices are shown in block diagram form, rather than in detail, in order to avoid obscuring embodiments of the present invention. These embodiments are described in sufficient detail to enable those of ordinary skill in the art to practice the invention, and it is to be understood that other embodiments may be utilized and that logical, mechanical, electrical, and other changes may be made without departing from the scope of embodiments of the present invention.

Thus, embodiments of the invention can be used to provide a high brightness OLED display. Embodiments of the invention are also used to improve image sharpness and to maintain color gamut. Some non-limiting examples of OLED systems where embodiments of the invention are used are, but are not limited to; mobile phone, large screen displays, use in a near-to-eye (NTE) display or a headset computing device. Other embodiments of the invention are readily implemented in a wearable or a head wearable device of general configuration, such as but not limited to; wearable products such as virtual reality (VR), augmented reality (AR), mixed reality (MR); wristband, watch, glasses, goggles, a visor, a head band, a helmet, etc. or the like. As used in this description of embodiments, wearable encompasses, head wearable, wrist wearable, neck wearable, thus any form of wearable that can be applied to a user.

While the invention has been described in terms of several embodiments, those of skill in the art will recognize that the invention is not limited to the embodiments described but can be practiced with modification and alteration within the spirit and scope of the appended claims. The description is thus to be regarded as illustrative instead of limiting.

What is claimed is:

1. An organic light emitting diode (OLED) display apparatus, comprising:
    an OLED device, the OLED device is formed with a first light emitting OLED stack, a charge generating layer (CGL), a second OLED stack, and a color filter, the OLED device further comprising:
        three sub-pixels, each sub-pixel has a separate anode, the three sub-pixels share a common cathode, the common cathode further comprising:
            a first layer, the first layer is a thin layer made of metal; and
            a second layer, the second layer is a thicker layer made from a transparent oxide, the common cathode has a lower surface that is closer to the separate anode and an upper surface that is further from the separate anode, the separate anode has a perimeter; and
        a dielectric barrier, the dielectric barrier is disposed between the separate anodes and around a perimeter of each separate anode of the three sub-pixels, the dielectric barrier extends above the separate anodes of the three sub-pixels into both of the first OLED stack and the second OLED stack, the dielectric barrier has a maximum height above the separate anode that is less than a minimum height of the upper surface of the common cathode located over the separate anode, thereby causing the CGL to have an undulating shape, such that in operation, when current flows to a desired sub-pixel of the three sub-pixels, lateral current flow through the CGL to adjacent sub-pixels is impeded, resulting in light generation by the desired sub-pixel and reduction in unwanted light generation at sub-pixels adjacent to the desired sub-pixel.

2. The apparatus of claim 1, wherein the color filter provides a different color filter to each of the three sub-pixels.

3. The apparatus of claim 2, wherein the colors of the different color filters are red, blue, and green.

4. The apparatus of claim 2, further comprising:
    a plurality of OLED devices disposed in an arrangement of rows and columns, providing at least 2560 rows of 2560 OLED devices in each row.

5. The apparatus of claim 3, wherein the apparatus is a micro-display.

6. The apparatus of claim 1, further comprising:
    three micro lenses, each micro lens of the three micro lenses is positioned above a different sub-pixel of the OLED device, in operation when light is emitted from the sub-pixels the micro lenses collimate the emitted light.

7. The apparatus of claim 6, further comprising:
a cover layer, the cover layer is disposed above the micro lenses to form a gap.

8. The apparatus of claim 7, wherein the gap is filed with either an inert gas or a vacuum is created in the gap.

9. The apparatus of claim 6, further comprising:
a cover layer; and
a fill material, the fill material is disposed between the micro lenses and the cover layer, wherein a refractive index of the fill material is less than a refractive index of the cover layer.

10. The apparatus of claim 1, wherein the CGL is thinned in the vicinity of the dielectric barrier.

11. The apparatus of claim 10, wherein the dielectric barrier has substantially vertical sides.

12. The apparatus of claim 1, wherein the CGL is discontinuous in the vicinity of the dielectric barrier.

13. The apparatus of claim 12, wherein the dielectric barrier is made from two different materials, a first material extends up from the separate anodes and defines a first region characterized by a first width, a second material is affixed to the first material, the second material extends up and defines a second region characterized by a second width, the two different materials are processed to make the second width wider than the first width.

14. The apparatus of claim 13, wherein the first material is made from silicon dioxide ($SiO_2$) and the second material is made from silicon mononitride (SiN).

15. An organic light emitting diode (OLED) pixel microstructure, comprising:
a plurality of pixel elements, each pixel element of the plurality further comprising:
three sub-pixels; each of the three sub-pixels further comprising in a vertical stack, in the following order, above a substrate:
an anode;
a first light emitting OLED stack;
a charge generation layer (CGL);
a second light emitting OLED stack;
a cathode, the cathode has a lower surface that is closer to the anode and an upper surface that is further from the anode; and
a dielectric barrier, the dielectric barrier is disposed between the anodes and around a perimeter of each anode, the dielectric barrier extends above the anodes into both of the first OLED stack and the second OLED stack, the dielectric barrier has a maximum height above the anode that is less than a minimum height of the upper surface of the cathode located over the anode, thereby causing the CGL to have an undulating shape, such that in operation, when current flows to a desired sub-pixel of the three sub-pixels, lateral current flow through the CGL to adjacent sub-pixels is impeded, resulting in light generation by the desired sub-pixel and reduction in unwanted light generation at sub-pixels adjacent to the desired sub-pixel.

16. The apparatus of claim 15, wherein the CGL is thinned in the vicinity of the dielectric barrier.

17. The apparatus of claim 15, wherein the CGL is discontinuous in the vicinity of the dielectric barrier.

18. The apparatus of claim 15, further comprising:
a color filter, the color filter is disposed above each anode, wherein the color filter passes light having a color selected from the group consisting of red, blue, and green.

19. The apparatus of claim 18, further comprising:
a micro lens, the micro lens is disposed above the color filter, in operation, the micro lens collimates light in a direction substantially normal to a plane of the micro lens, thereby reducing an aperture of emitted light.

20. The apparatus of claim 15, wherein the dielectric barrier is made from two different materials, a first material extends up from the separate anodes and defines a first region characterized by a first width, a second material is affixed to the first material, the second material extends up and defines a second region characterized by a second width, the two different materials are processed to make the second width wider than the first width.

21. The apparatus of claim 15, the cathode further comprising:
a first layer, first layer is a thin layer made of metal; and
a second layer, the second layer is a thicker layer made from a transparent oxide.

22. The apparatus of claim 21, wherein the metal is selected from the group consisting of Silver and Silver/Magnesium.

23. The apparatus of claim 21, wherein the transparent oxide is selected from the group consisting of Indium Tin Oxide and Indium Zinc Oxide.

24. A method to reduce undesired light generation on adjacent sub-pixels in an OLED microstructure, comprising:
creating a dielectric barrier in the OLED microstructure, the dielectric barrier is created between each separate anode and around a perimeter of each separate anode; and
creating an undulating pattern in:
1. a first OLED stack;
2. a charge generating layer of the OLED microstructure;
3. a second OLED stack; and
4. a cathode, the cathode has a lower surface and an upper surface, the dielectric barrier extends above each separate anode into both the first OLED stack and the second OLED stack, the dielectric barrier has a maximum height above each separate anode that is less than a minimum height of the upper surface of the cathode located over each separate anode, thereby causing a CGL to have an undulating shape, such that in operation, when current flows to a desired sub-pixel, lateral current flow through the CGL to adjacent sub-pixels is impeded, resulting in light generation by the desired sub-pixel and reduction in unwanted light generation at sub-pixels adjacent to the desired sub-pixel.

25. The method of claim 24, wherein the CGL is thinned in the vicinity of the dielectric barrier.

26. The method of claim 24, wherein the CGL is discontinuous in the vicinity of the dielectric barrier.

27. The method of claim 24, further comprising:
adding a color filter above each separate anode, wherein the color filter passes light having a color selected from the group consisting of red, blue, and green.

28. The method of claim 24, further comprising:
forming a micro lens over each separate anode, in operation, each micro lens collimates light in a direction substantially normal to a plane of the micro lens, thereby reducing an aperture of emitted light.

29. The method of claim 28, wherein the forming includes a heating and melt back of lens material to form the micro lens.

30. The method of claim 28, wherein the forming includes etching of lens material to form the micro lens.

31. The method of claim 24, wherein the dielectric barrier is made from two different materials, a first material extends up from each separate anode and defines a first region characterized by a first width, a second material is affixed to the first material, the second material extends up and defines a second region characterized by a second width, the two different materials are processed to make the second width wider than the first width.

32. The method of claim 24, the cathode further comprising:
a first layer, first layer is a thin layer made of metal; and
a second layer, the second layer is a thicker layer made from a transparent oxide.

33. The method of claim 32, wherein the metal is selected from the group consisting of Silver and Silver/Magnesium.

34. The method of claim 32, wherein the transparent oxide is selected from the group consisting of Indium Tin Oxide and Indium Zinc Oxide.

35. An organic light emitting diode (OLED) display apparatus, comprising:
an OLED device, the OLED device is formed with a first light emitting OLED stack, a charge generating layer (CGL), a second light emitting OLED stack, and a color filter, the OLED device further comprising:
three sub-pixels, each sub-pixel has a separate anode and the separate anode has a perimeter;
a common cathode, the common cathode has a lower surface that is closer to the separate anode and an upper surface that is further from the separate anode;
a dielectric barrier, the dielectric barrier is disposed between the separate anodes and around the perimeter of each separate anode of the three sub-pixels, the dielectric barrier extends above the separate anodes of the three sub-pixels into both of the first OLED stack and the second OLED stack, the dielectric barrier has a maximum height above the separate anode that is less than a minimum height of the upper surface of the cathode located over the separate anode, thereby causing the CGL to have an undulating shape; and
a micro lens, the micro lens has a plane and the micro lens is configured over each sub-pixel, in operation, each micro lens collimates light in a direction normal to a plane, thereby minimizing stray light, and when current flows to a desired sub-pixel of the three sub-pixels, lateral current flow through the CGL to adjacent sub-pixels is impeded, resulting in light generation by the desired sub-pixel and reduction in unwanted light generation at sub-pixels adjacent to the desired sub-pixel.

36. The apparatus of claim 35, further comprising:
a cover, the cover is disposed above the micro lenses and creates a gap between the micro lenses and an underside of the cover.

37. The apparatus of claim 36, wherein the gap contains an inert gas.

38. The apparatus of claim 36, wherein a vacuum is created in the gap.

39. The apparatus of claim 36, wherein the gap is filled with a resin and a refractive index of micro lens material is greater than a refractive index of the resin.

40. The apparatus of claim 35, wherein the CGL is thinned in the vicinity of the dielectric barrier.

41. The apparatus of claim 40, wherein the dielectric barrier has substantially vertical sides.

42. The apparatus of claim 35, wherein the CGL is discontinuous in the vicinity of the dielectric barrier.

43. The apparatus of claim 42, wherein the dielectric barrier is made from two different materials, a first material extends up from the separate anodes and defines a first region characterized by a first width, a second material is affixed to the first material, the second material extends up and defines a second region characterized by a second width, the two different materials are processed to make the second width wider than the first width.

44. The apparatus of claim 43, wherein the first material is made from silicon dioxide ($SiO_2$) and the second material is made from silicon mononitride (SiN).

\* \* \* \* \*